United States Patent
Makino et al.

(10) Patent No.: US 10,630,389 B2
(45) Date of Patent: Apr. 21, 2020

(54) OPTICAL TRANSCEIVER DEVICE AND OPTICAL TRANSCEIVER MODULE THAT INCLUDES OPTICAL TRANSCEIVER DEVICE

(71) Applicant: Fujitsu Optical Components Limited, Kawasaki-shi, Kanagawa (JP)

(72) Inventors: Shuntaro Makino, Kawasaki (JP); Kohei Shibata, Isehara (JP); Suguru Akiyama, Tsukuba (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/276,215

(22) Filed: Feb. 14, 2019

(65) Prior Publication Data

US 2019/0280776 A1    Sep. 12, 2019

(30) Foreign Application Priority Data

Mar. 8, 2018 (JP) ................................ 2018-041879

(51) Int. Cl.

| H04B 10/40 | (2013.01) |
|---|---|
| H04B 10/516 | (2013.01) |
| G02F 1/01 | (2006.01) |
| G02F 1/225 | (2006.01) |
| H03F 3/08 | (2006.01) |
| G02F 1/21 | (2006.01) |

(52) U.S. Cl.
CPC ........... *H04B 10/40* (2013.01); *G02F 1/0121* (2013.01); *G02F 1/225* (2013.01); *H04B 10/516* (2013.01); *G02F 2001/212* (2013.01); *H03F 3/08* (2013.01)

(58) Field of Classification Search
CPC ....... H04B 10/40; H04B 10/516; G02F 1/225; G02F 1/0121; G02F 2001/212; H03F 3/08
USPC .................................. 398/135–139, 182–214
See application file for complete search history.

(56) References Cited

U.S. PATENT DOCUMENTS

| 5,026,134 A | * | 6/1991 | Sugawara | ................ G02B 6/42 |
|---|---|---|---|---|
| | | | | 257/E31.108 |
| 5,127,075 A | * | 6/1992 | Althaus | ................ G02B 6/4246 |
| | | | | 250/227.14 |
| 5,552,918 A | * | 9/1996 | Krug | .................... G02B 6/4207 |
| | | | | 385/33 |

(Continued)

FOREIGN PATENT DOCUMENTS

| JP | 2002-51015 | 2/2002 |
|---|---|---|
| JP | 2015-216169 | 12/2015 |

*Primary Examiner* — Dibson J Sanchez
(74) *Attorney, Agent, or Firm* — Staas & Halsey LLP

(57) ABSTRACT

An optical transceiver device includes: an optical circuit that includes an optical modulator to generate a modulated optical signal and an optical reception circuit to convert a received optical signal into an electric signal and implemented in a rectangular optical circuit area; a driver circuit that drives the optical modulator and arranged along a first side of the optical circuit area; an amplifier circuit that converts an output signal of the optical reception circuit into a voltage signal and arranged along a second side of the optical circuit area, the second side being orthogonal to the first side; a first electrical component that is electrically coupled to the driver circuit and arranged in an area adjacent to the driver circuit; and a second electrical component that is electrically coupled to the amplifier circuit and arranged in an area adjacent to the amplifier circuit.

8 Claims, 13 Drawing Sheets

(56) References Cited

U.S. PATENT DOCUMENTS

| | | | | |
|---|---|---|---|---|
| 6,040,934 A * | 3/2000 | Ogusu | G02B 6/4208 | 372/6 |
| 6,334,716 B1 * | 1/2002 | Ojima | G02B 6/4246 | 385/88 |
| 6,493,121 B1 * | 12/2002 | Althaus | G02B 6/4246 | 398/135 |
| 7,257,332 B2 * | 8/2007 | Imai | G02F 1/0123 | 398/182 |
| 7,403,716 B2 * | 7/2008 | Lo | G02B 6/4246 | 385/88 |
| 8,041,226 B2 * | 10/2011 | Kato | H04B 10/40 | 375/232 |
| 9,008,474 B2 * | 4/2015 | Nakanishi | G02B 6/4206 | 385/33 |
| 9,450,679 B2 * | 9/2016 | Nishimoto | H04B 10/616 | |
| 9,651,751 B1 | 5/2017 | Ding et al. | | |
| 2004/0208601 A1 * | 10/2004 | Tan | G02B 6/4206 | 398/135 |
| 2005/0036730 A1 * | 2/2005 | Shyu | G02B 6/4215 | 385/14 |
| 2006/0198571 A1 * | 9/2006 | Allouche | H04B 10/40 | 385/14 |
| 2006/0216032 A1 * | 9/2006 | Millard | H01L 23/49838 | 398/135 |
| 2006/0280211 A1 * | 12/2006 | Garez | H01S 5/06832 | 372/38.01 |
| 2007/0058988 A1 * | 3/2007 | Yonenaga | H04B 10/5051 | 398/186 |
| 2007/0237465 A1 * | 10/2007 | Okada | G02B 6/4246 | 385/92 |
| 2007/0280578 A1 * | 12/2007 | Glebov | G02F 1/0356 | 385/2 |
| 2008/0044141 A1 * | 2/2008 | Willis | G02B 6/3887 | 385/88 |
| 2008/0107423 A1 * | 5/2008 | Lee | H04B 10/40 | 398/136 |
| 2009/0092357 A1 * | 4/2009 | Ozawa | G02B 6/4214 | 385/31 |
| 2009/0103927 A1 * | 4/2009 | Cunningham | H04B 10/6971 | 398/139 |
| 2009/0185810 A1 * | 7/2009 | Kaplan | G02F 1/225 | 398/184 |
| 2009/0220245 A1 * | 9/2009 | Yu | H04B 10/40 | 398/139 |
| 2010/0008675 A1 * | 1/2010 | De Dobbelaere | G02B 6/4246 | 398/135 |
| 2010/0054757 A1 * | 3/2010 | Smith | G02F 1/0123 | 398/198 |
| 2010/0095110 A1 * | 4/2010 | Noble | H04L 9/0891 | 713/153 |
| 2010/0158530 A1 * | 6/2010 | Soto | H04B 10/40 | 398/79 |
| 2011/0042553 A1 * | 2/2011 | Masini | H03F 3/08 | 250/214 A |
| 2011/0217045 A1 * | 9/2011 | Watson | G02B 6/12002 | 398/79 |
| 2011/0299855 A1 * | 12/2011 | Huang | H04B 10/40 | 398/135 |
| 2013/0188965 A1 * | 7/2013 | Afriat | H04B 10/60 | 398/136 |
| 2014/0178079 A1 * | 6/2014 | Yagisawa | G02B 6/4246 | 398/139 |
| 2014/0193160 A1 * | 7/2014 | Yagisawa | G02B 6/4246 | 398/136 |
| 2015/0180582 A1 * | 6/2015 | Zhou | H03F 3/08 | 398/182 |
| 2015/0188639 A1 * | 7/2015 | Akashi | H04B 10/50575 | 398/197 |
| 2015/0245114 A1 * | 8/2015 | Ho | H04B 10/079 | 398/34 |
| 2015/0323738 A1 | 11/2015 | Sekiguchi et al. | | |
| 2015/0341119 A1 * | 11/2015 | Fincato | H04B 10/801 | 398/139 |
| 2017/0045697 A1 | 2/2017 | Hochberg et al. | | |
| 2019/0285815 A1 * | 9/2019 | Sugiyama | H04B 10/516 | |
| 2019/0288786 A1 * | 9/2019 | Nagarajan | H04B 10/40 | |

* cited by examiner

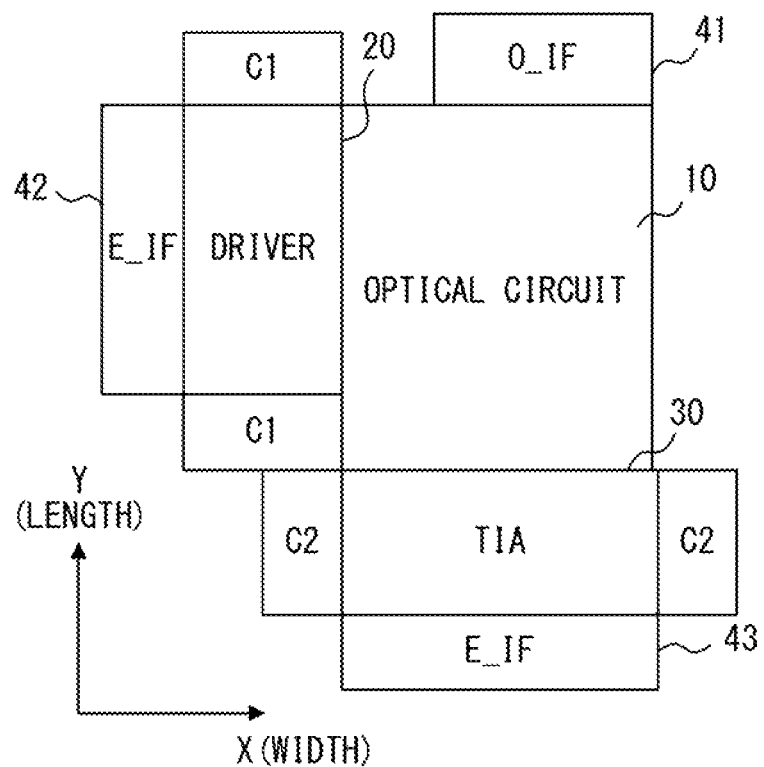
F I G. 1 1 A
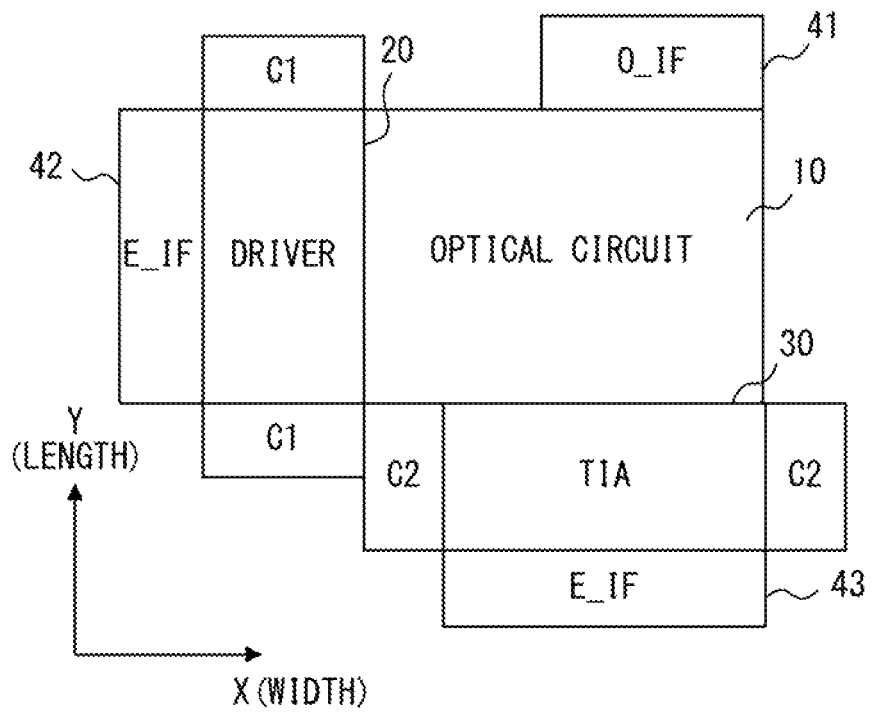
F I G. 1 1 B

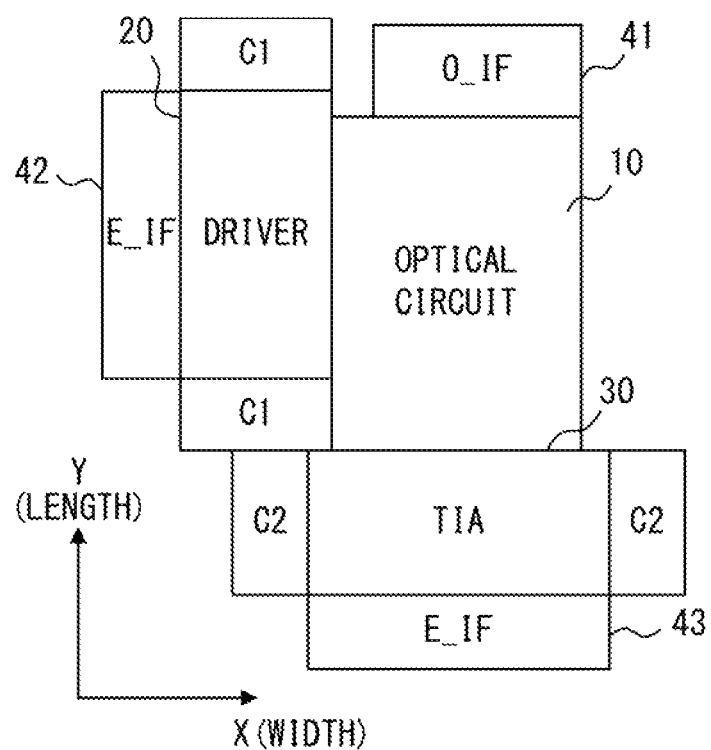
F I G. 1 2 A
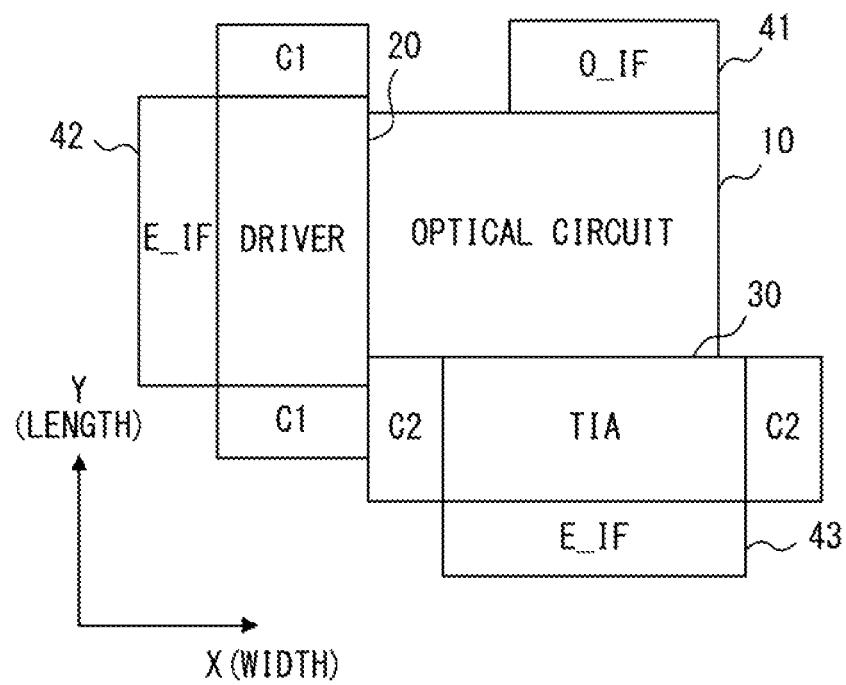
F I G. 1 2 B

OPTICAL TRANSCEIVER DEVICE AND OPTICAL TRANSCEIVER MODULE THAT INCLUDES OPTICAL TRANSCEIVER DEVICE

CROSS-REFERENCE TO RELATED APPLICATION

This application is based upon and claims the benefit of priority of the prior Japanese Patent Application No. 2018-041879, filed on Mar. 8, 2018, the entire contents of which are incorporated herein by reference.

FIELD

The embodiments discussed herein are related to an optical transceiver device and an optical transceiver module that includes the optical transceiver device.

BACKGROUND

A demand for high-speed optical transceiver devices has been increased to provide large-capacity communications. An optical transceiver device includes, for example, an optical modulator that generates an optical signal, a driver circuit that drives the optical modulator in accordance with a data signal, an optical reception circuit that converts a received optical signal into an electric signal, and a TIA (transimpedance amplifier) circuit that converts the electric signal (current signal) output from the optical reception circuit into a voltage signal.

In many cases, an optical transceiver device is implemented in an optical module together with a light source. A demand for reducing the size of optical modules has been increased. Thus, a demand for reducing the size of optical transceiver devices to be implemented in optical modules has also been increased.

FIG. 1A illustrates an example of an optical module. The optical module includes, for example, a light source and a digital signal processor in addition to an optical transceiver device. Optical access corresponds to an interface to be connected to an optical network. Electrical access corresponds to an electrical interface to be connected to an information processing device.

An optical module is used in, for example, communication equipment for connecting many information processing devices to an optical network. In this case, many optical modules may be implemented in the communication equipment, and each of the optical modules needs to have a narrow width W1.

FIG. 1B illustrates an example of an optical transceiver device. An optical transceiver device 100 includes an optical circuit area 110, a driver circuit 120, and a TIA circuit 130. An optical integrated circuit is implemented in the optical circuit area 110. The optical integrated circuit includes an optical modulator that generates a modulated optical signal and an optical reception circuit that converts a received optical signal into an electric signal. The driver circuit 120 drives the optical modulator in accordance with a data signal supplied via an electrical interface. The TIA circuit 130 converts an electric signal (current signal) output from the optical reception circuit into a voltage signal. In addition, a peripheral circuit (e.g., an electrical component such as a capacitor) electrically coupled to the driver circuit 120 is implemented in the vicinity of the driver circuit 120, and a peripheral circuit (e.g., an electrical component such as a capacitor) electrically coupled to the TIA circuit 130 is implemented in the vicinity of the TIA circuit 130. Note that "P" in FIG. 1B indicates a peripheral circuit. A terminal circuit terminates a driving signal supplied from the driver circuit 120 to the optical modulator.

As a related technique, Japanese Laid-open Patent Publication No. 2002-051015 describes a data-communication interface device that performs a full duplex communication. This interface device includes an optical transceiver and an electric-control/interface circuit. The optical transceiver includes a hybrid optical integrated circuit, an LD driver, and an optical amplifier for a photo detector. Other related techniques are described in Japanese Laid-open Patent Publication No. 2015-216169, U.S. Patent Publication No. 2017/0045697, and U.S. Pat. No. 9,651,751.

The optical transceiver device 100 depicted in FIG. 1B is implemented in, for example, the optical module depicted in FIG. 1A. In this case, in order to reduce the size of the optical module, the optical transceiver device 100 needs to have a narrow width W2 in FIG. 1B.

SUMMARY

According to an aspect of the embodiments, an optical transceiver device includes: an optical circuit that includes an optical modulator to generate a modulated optical signal and an optical reception circuit to convert a received optical signal into an electric signal, and that is implemented in a rectangular optical circuit area; a driver circuit that drives the optical modulator, and that is arranged along a first side among four sides of the optical circuit area; an amplifier circuit that converts an output signal of the optical reception circuit into a voltage signal, and that is arranged along a second side among the four sides of the optical circuit area, the second side being orthogonal to the first side; a first electrical component that is electrically coupled to the driver circuit, and that is arranged in an area adjacent to the driver circuit; and a second electrical component that is electrically coupled to the amplifier circuit, and that is arranged in an area adjacent to the amplifier circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 10A, 10B, 11A, 11B, 12A, and 12B illustrate variations of arrangements in an optical transceiver device.

DESCRIPTION OF EMBODIMENTS

Figure 2:
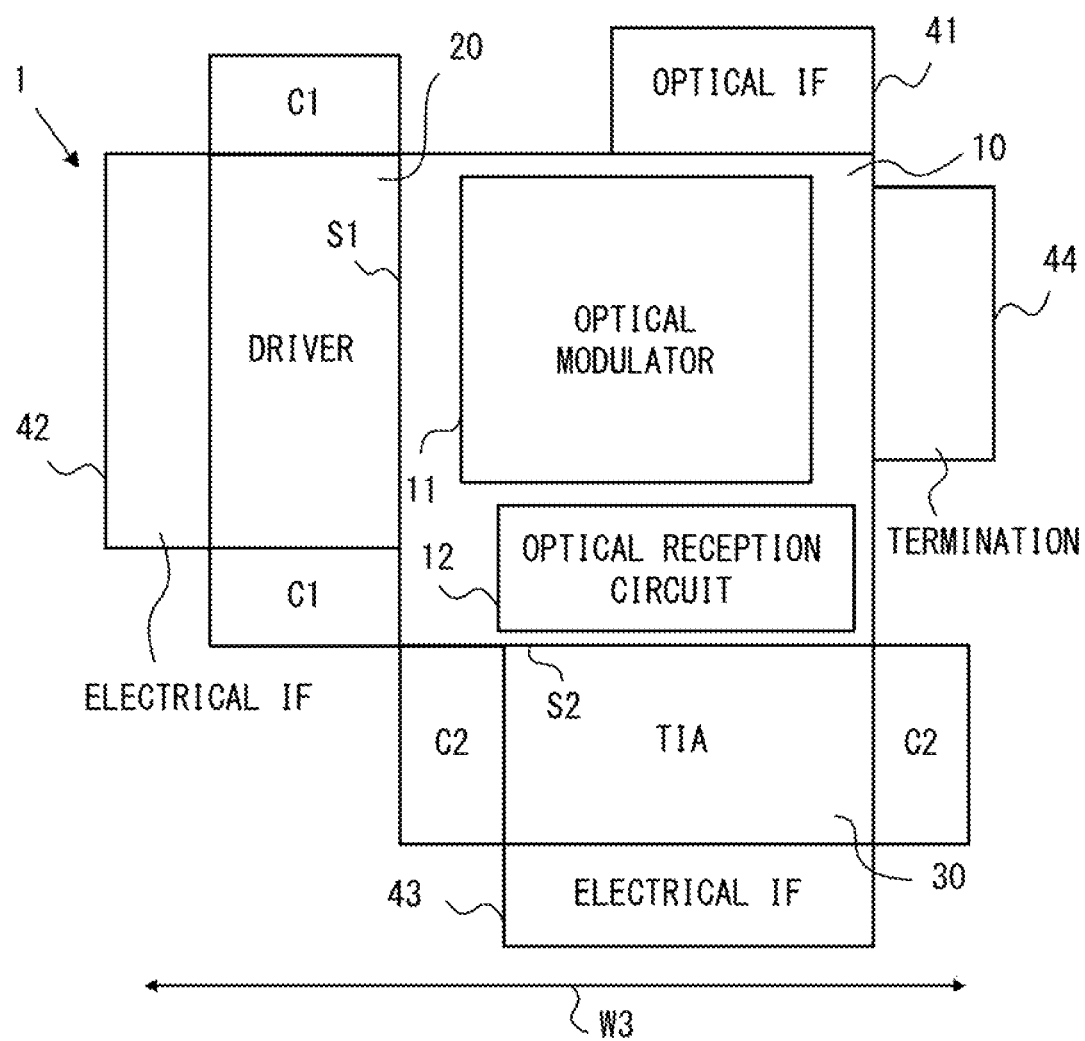
FIG. 2 illustrates an example of an optical transceiver device in accordance with embodiments of the invention.

FIG. 2 illustrates an example of an optical transceiver device in accordance with embodiments of the invention. As depicted in FIG. 2, an optical transceiver device 1 includes an optical circuit formed in an optical circuit area 10, a driver circuit 20, and a TIA circuit 30. The optical transceiver device 1 also includes an optical interface 41, electrical interfaces 42 and 43, and a termination circuit 44.

The optical circuit area 10 has a rectangular shape. An optical circuit is implemented in the optical circuit area 10. The optical circuit includes an optical modulator 11 that generates a modulated optical signal and an optical reception circuit 12 that converts a received optical signal into an electric signal. The optical signal generated by the optical modulator 11 is output to an optical network via the optical interface 41. The optical signal received via the optical interface 41 is guided to the optical reception circuit 12. For example, the optical reception circuit 12 may include a 90-degree optical hybrid circuit and photodetectors and covert the received optical signal into electric signals.

The driver circuit 20 is disposed along one of four sides of the optical circuit area 10 (hereinafter referred to as "side S1"). The driver circuit 20 drives the optical modulator 11. In particular, the driver circuit 20 is supplied with a data signal via the electrical interface 42. According to the data signal, the driver circuit 20 generates a driving signal to drive the optical modulator 11. The driving signal propagates via a signal electrode formed in the optical circuit area 10 and is terminated by the termination circuit 44.

The TIA circuit 30 is formed along one of the four sides of the optical circuit area 10 orthogonal to the side S1 (hereinafter referred to as "side S2"). The TIA circuit 30 includes a TIA that converts an electric signal (current signal) output from the optical reception circuit 12 into a voltage signal. The voltage signal generated by the TIA circuit 30 is output via the electrical interface 43. The voltage signal output via the electrical interface 43 is guided to, for example, a digital signal processor (DSP). In this case, the digital signal processor recovers data based on the voltage signal.

A peripheral circuit C1 electrically coupled to the driver circuit 20 is implemented in the vicinity of the driver circuit 20. A peripheral circuit C2 electrically coupled to the TIA circuit 30 is implemented in the vicinity of the TIA circuit 30. In particular, at least a portion of the peripheral circuit C1 is implemented in an area that is located outside the optical circuit area 10, adjacent to the driver circuit 20, and positioned on a side on which the TIA circuit 30 is provided with respect to the driver circuit 20. At least a portion of the peripheral circuit C2 is implemented in an area that is located outside the optical circuit area 10, adjacent to the TIA circuit 30, and positioned on a side on which the driver circuit 20 is provided with respect to the TIA circuit 30. Alternatively, at least portions of the peripheral circuits C1 and C2 may be disposed in an area that is located outside the optical circuit area 10 and sandwiched between the driver circuit 20 and the TIA circuit 30. In the example depicted in FIG. 2, portions of the peripheral circuits C1 and C2 are implemented in an area adjacent to the lower-left portion of the optical circuit area 10 (an area adjacent to the lower edge of the driver circuit 20 and to the left edge of the TIA circuit 30).

Figures 1A, 1B:
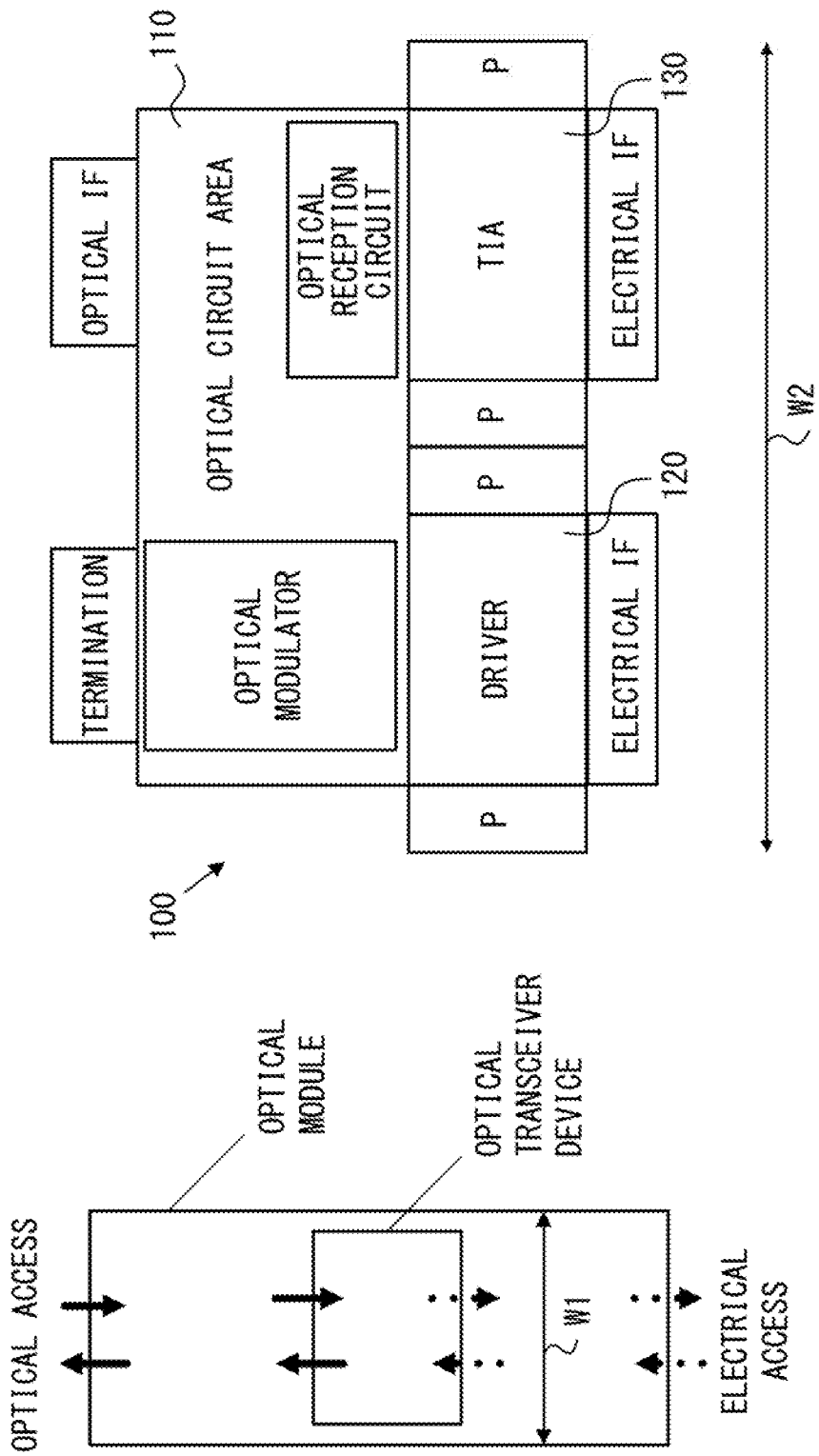
FIG. 1A illustrates an example of an optical module.
FIG. 1B illustrates an example of an optical transceiver module.

The optical transceiver device 1 depicted in FIG. 2 is provided with almost the same functions as those of the optical transceiver device 100 depicted in FIG. 1B. The optical transceiver device 100 depicted in FIG. 1B includes a driver circuit and a TIA circuit disposed along one of the four sides of the optical circuit area 110. Hence, it would be difficult for the optical circuit area 110 to have a narrow width W2. In the optical transceiver device 1, by contrast, as depicted in FIG. 2, the driver circuit 20 is implemented along the side S1, and the TIA circuit 30 is implemented along the side S2 orthogonal to the side S1. Hence, the optical transceiver device 1 can have a width W3 narrower than the width W2 of the optical transceiver device 100 depicted in FIG. 1B.

When a data signal is a high-speed signal, to mitigate signal attenuation or degradation, the driver circuit 20 and the optical modulator 11 need to be positioned in proximity to each other, and the TIA circuit 30 and the optical reception circuit 12 need to be positioned in proximity to each other. In the configuration depicted in FIG. 1B, accordingly, the optical modulator and the optical reception circuit are arranged next to each other in a lateral direction. However, an optical modulator is typically larger in size than an optical reception circuit. Accordingly, the utilization efficiency of the space of the optical circuit area 110 is not high (a wide space is wasted) in the configuration depicted in FIG. 1B.

In the optical transceiver device 1, by contrast, the optical modulator 11 and the optical reception circuit 12 are arranged next to each other in a longitudinal direction, as depicted in FIG. 2. Hence, the utilization efficiency of the space of the optical circuit area 10 is high (a small space is wasted) in the optical transceiver device 1. Also in terms of this, the optical transceiver device 1 can be reduced in size. Note that also in the optical transceiver device 1, the driver circuit 20 and the optical modulator 11 are positioned in proximity to each other and the TIA circuit 30 and the optical reception circuit 12 are positioned in proximity to each other.

Figure 3:
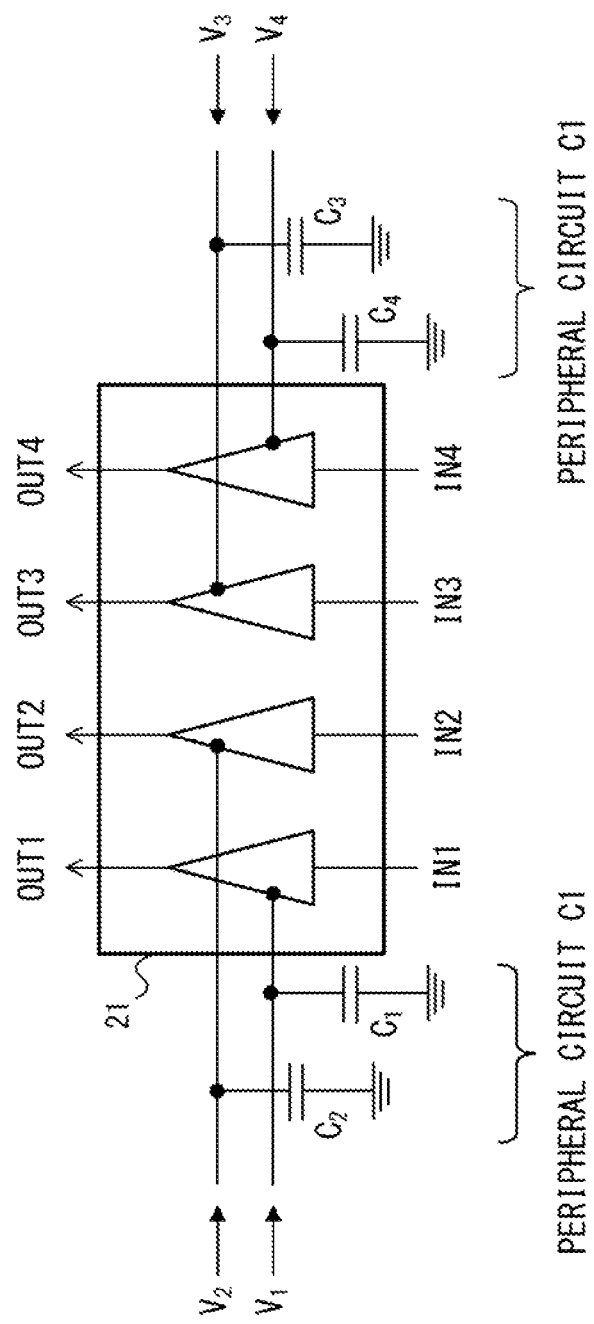
FIG. 3 illustrates an example of a driver circuit and a peripheral circuit thereof.

FIG. 3 illustrates an example of the driver circuit 20 and a peripheral circuit thereof. In this example, the optical transceiver device 1 transmits a polarization multiplexed optical signal. Accordingly, four electric signals (IN1, IN2, IN3, and IN4) are input to the driver circuit 20. In this case, for example, electric signals IN1 and IN2 may be used to generate an X-polarized optical signal, and electric signals IN3 and IN4 are used to generate a Y-polarized optical signal.

The driver circuit 20 includes four amplifiers. The amplifiers respectively amplify input electric signals IN1-IN4 so as to generate output signals OUT1-OUT4. The output signals of the driver circuit 20 are supplied to the optical modulator 11 as a driving signal. The amplifiers are respectively supplied with power-supply voltages $V_1$-$V_4$. However, when the power-supply voltage is varied, the quality of the output signal of the amplifier is decreased. Accordingly, power lines for supplying the power-supply voltages to the amplifiers are respectively grounded by a capacitor. In particular, the power lines for supplying power-supply voltages $V_1$-$V_4$ are respectively grounded by capacitors $C_1$-$C_4$. Note that capacitors $C_1$-$C_4$ correspond to the peripheral circuit C1 depicted in FIG. 2. In this case, for example, capacitors $C_1$-$C_2$ may be disposed on one side of the driver circuit 20, and capacitors $C_3$-$C_4$ may be disposed on another side of the driver circuit 20.

Figure 4:
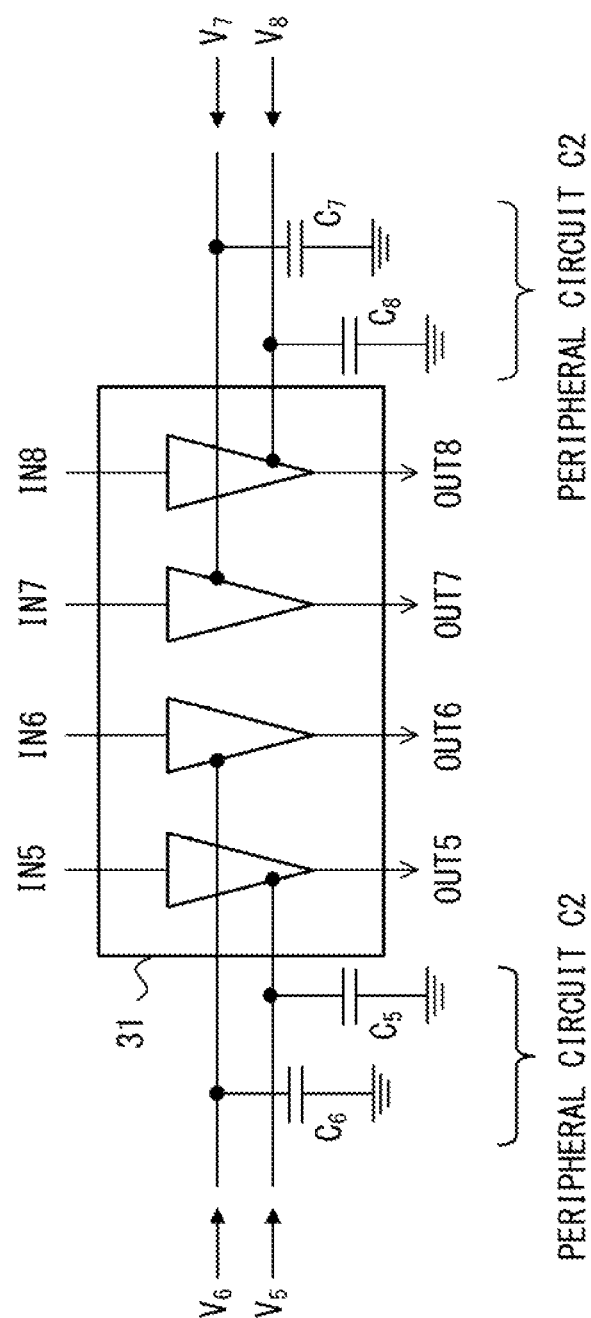
FIG. 4 illustrates an example of a TIA circuit and a peripheral circuit thereof.

FIG. 4 illustrates an example of the TIA circuit 30 and a peripheral circuit thereof. In this example, the optical transceiver device 1 receives a polarization multiplexed optical signal. Accordingly, four electric signals (IN5, IN6, IN7, and IN8) are input from the optical reception circuit 12 to the TIA circuit 30. In this case, for example, electric signals IN5 and IN6 may respectively indicate I component and Q component of H polarization of a received optical signal, and electric signals IN7 and IN8 may respectively indicate I component and Q component of V polarization of the received optical signal.

The TIA circuit 30 includes four amplifiers. The amplifiers respectively amplify input electric signals IN5-IN8 so as to generate output signals OUT5-OUT8. The output signals of the TIA circuit 30 are supplied to the optical modulator 11 as a driving signal. The output signal of the TIA circuit 30 is guided to a digital signal processor (not illustrated) as an electric field information signal indicating a received optical signal. The amplifiers are respectively supplied with power-supply voltages $V_5$-$V_8$. However, when the power-supply voltage is varied, the quality of the output signal of the amplifier is decreased. Accordingly, power lines for supplying power-supply voltages to the amplifiers are respectively each grounded by a capacitor. In particular, the power lines for supplying the power-supply voltages $V_5$-$V_8$ are respectively grounded by capacitors $C_5$-$C_8$. Note that capacitors $C_5$-$C_8$ correspond to the peripheral circuit C2 depicted in FIG. 2. In this case, for example, capacitors $C_5$-$C_6$ may be disposed on the left side of the TIA circuit 30, and capacitors $C_7$-$C_8$ may be disposed on the right side of the TIA circuit 30.

Figure 5:
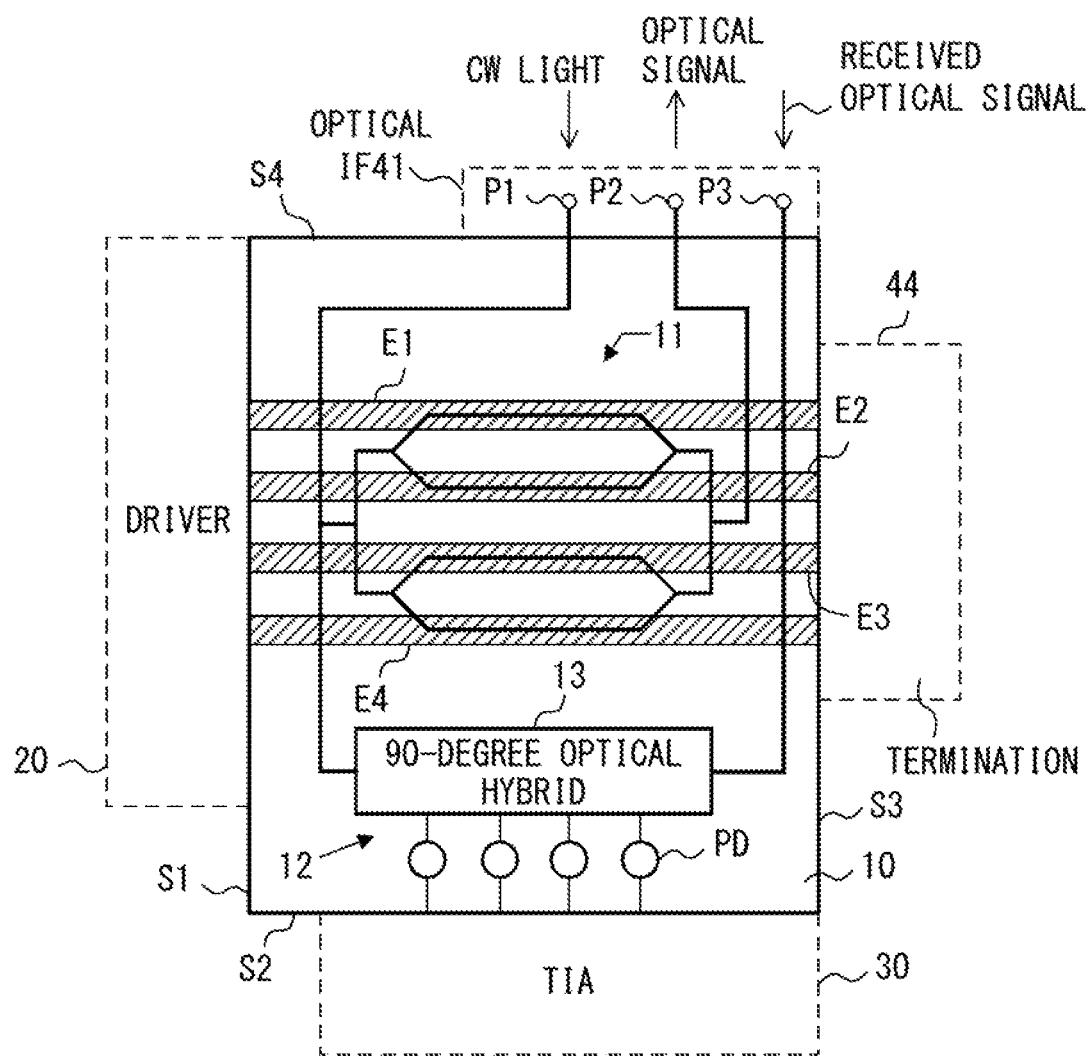
FIG. 5 illustrates an example of an optical circuit implemented in an optical transceiver device.

FIG. 5 illustrates an example of an optical circuit implemented in the optical transceiver device 1. As described above, the optical circuit is implemented in the optical circuit area 10. The optical circuit area 10 has a rectangular shape and formed by four sides S1-S4. The optical circuit includes the optical modulator 11 and the optical reception circuit 12. In this example, the optical reception circuit 12 includes a 90-degree optical hybrid circuit 13 and a plurality of photodetectors PD. The plurality of photodetectors PD are arranged along the side S2 of the optical circuit area 10. The 90-degree optical hybrid circuit 13 is located adjacent to the plurality of photodetectors PD. The optical reception circuit 12 may have a direct-detection configuration provided with a plurality of photodetectors PD performing an intensity modulation, e.g., a configuration based on a pulse amplitude modulation (PAM) scheme.

In this example, the optical interface 41 includes three ports P1-P3. Port P1 is supplied with continuous wave light generated by a light source (not illustrated). Port P2 outputs an optical signal generated by the optical modulator 11. Port P3 is supplied with a received optical signal. The continuous wave light may be supplied from a light source integrated on the optical circuit directly to an optical wiring. In this case, the optical interface 41 does not need to include port P1.

An optical wiring optically coupled to port P1 is branched on the optical circuit and optically coupled to an input terminal of the optical modulator 11 and an input terminal of the 90-degree optical hybrid circuit 13. Thus, input continuous wave light is guided to the optical modulator 11 and the 90-degree optical hybrid circuit 13. An optical wiring optically coupled to port P2 is optically coupled to an output terminal of the optical modulator 11. Thus, a modulated optical signal generated by the optical modulator 11 is guided to port P2. An optical wiring optically coupled to port P3 is optically coupled to another input terminal of the 90-degree optical hybrid circuit 13. Thus, a received optical signal is guided to the 90-degree optical hybrid circuit 13. The above-described optical wirings are implemented by, for example, optical waveguides.

The optical modulator 11 is a Mach-Zehnder modulator and includes optical waveguides and signal electrodes. In this example, since the optical transceiver device 1 transmits a polarization multiplexed optical signal, the optical modulator 11 includes an X-polarization modulator and a Y-polarization modulator. The X-polarization modulator and the Y-polarization modulator are arranged in parallel to each other. The X-polarization modulator and the Y-polarization modulator respectively include a pair of arms (I arm and Q arm).

Signal electrodes E1-E4 are formed in parallel to each other in the optical circuit area 10. In this example, each of the signal electrodes E1-E4 is extended straight from the side S1 to the side S3. Signal electrodes E1-E4 are respectively supplied with signals OUT1-OUT4 generated by the driver circuit 20 depicted in FIG. 3.

Each of the optical waveguides that are components of the optical modulator 11 is formed along a corresponding signal electrode of signal electrodes E1-E4. For example, an I-arm optical waveguide of the X-polarization modulator may be formed along signal electrode E1, a Q-arm optical waveguide of the X-polarization modulator is formed along signal electrode E2, an I-arm optical waveguide of the Y-polarization modulator is formed along signal electrode E3, and a Q-arm optical waveguide of the Y-polarization modulator is formed along signal electrode E4.

As described above, continuous wave light is input to the optical modulator 11. While passing through the optical waveguides of the optical modulator 11, the continuous wave light is modulated in accordance with a driving signal supplied to a corresponding signal electrode. Accordingly, a modulated optical signal is generated by respectively supplying signals OUT1 and OUT2 to signal electrodes E1 and E2, and similarly a modulated optical signal is generated by respectively supplying signals OUT3 and OUT4 to signal electrodes E3 and E4. The two modulated optical signals are combined by a polarization beam combiner (not illustrated) so as to generate a polarization multiplexed optical signal. The polarization multiplexed optical signal is output via port P2.

As described above, the optical reception circuit 12 includes 90-degree optical hybrid circuit 13 and four photodetectors PD. Continuous wave light and a received optical signal are input to the 90-degree optical hybrid circuit 13. The 90-degree optical hybrid circuit 13 obtains I component of H polarization, Q component of H polarization, I component of V polarization, and Q component of V polarization of the received optical signal by a coherent detection using the continuous wave light. Operations of the 90-degree optical hybrid circuit 13 are well known, and descriptions thereof are omitted herein.

The four photodetectors PD convert I component of H polarization, Q component of H polarization, I component of V polarization, and Q component of V polarization of the received optical signal into electric signals. Each photodetector PD may generate a current that has a proportional relationship with the intensity of input light.

The electric signals generated by the four photodetectors PD are guided to the TIA circuit 30. In the example depicted in FIG. 4, the electric signals generated by the four photodetectors PD correspond to signals IN5-IN8. Thus, the TIA circuit 30 converts the electric signals generated by the optical reception circuit 12 into voltage signals.

In the configuration depicted in FIG. 5, accordingly, signal electrodes E1-E4 is extended straight and thus have short lengths, and hence the attenuation or degradation of a driving signal is mitigated. In the layout depicted in FIG. 5, optical waveguides do not cross each other, so that a high quality optical communication can be performed.

Optical Module

Figure 6:
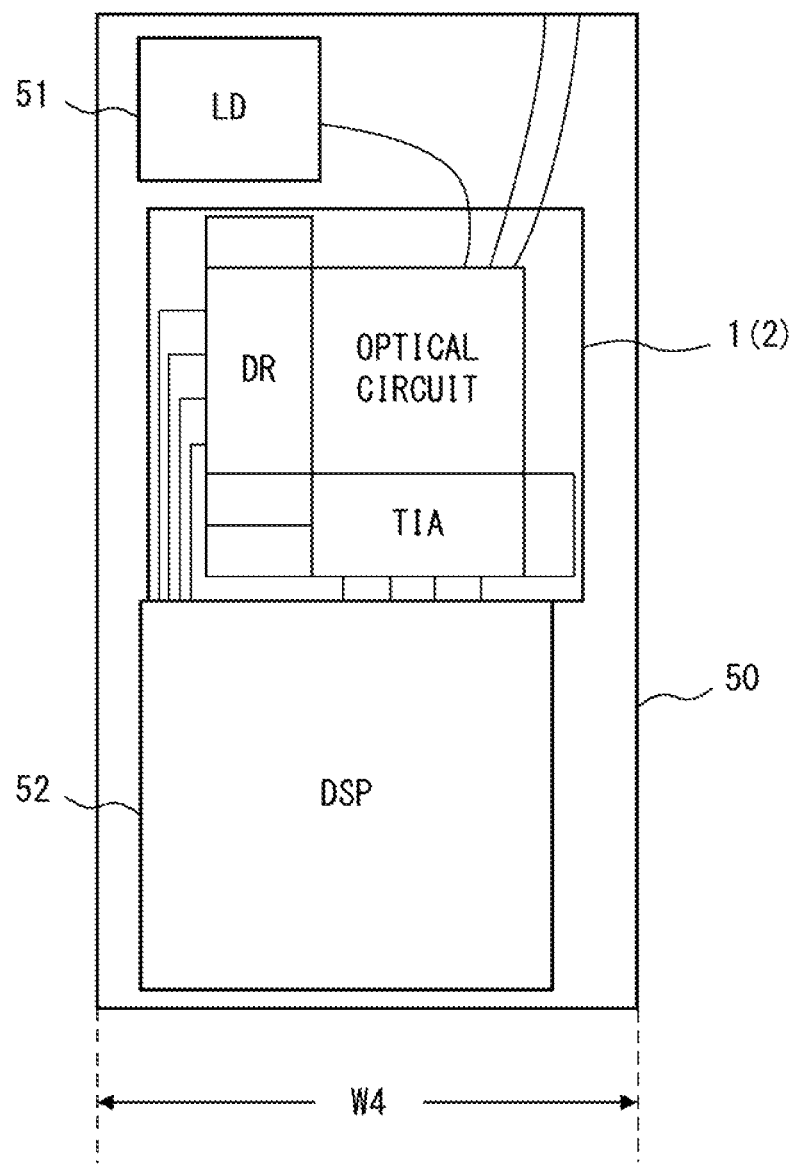
FIG. 6 illustrates an example of an optical module in which an optical transceiver device is implemented.

FIG. 6 illustrates an example of an optical module in which an optical transceiver device is implemented. In this example, an optical module 50 includes a light source (LD) 51, an optical transceiver device 1, and a digital signal processor (DSP) 52. The light source 51 generates continuous wave light of a specified wavelength. The continuous wave light is guided to the optical transceiver device 1. In the example depicted in FIG. 5, the continuous wave light is guided to a port P1 of the optical transceiver device 1. In this example, the optical transceiver device 1 is provided by the configuration depicted in FIG. 5. However, the optical transceiver device 1 is implemented in a package described hereinafter.

The digital signal processor 52 generates a data signal by performing, for example, a mapping process on a transmission data string supplied from an information processing device. The data signal is supplied to the driver circuit 20. The digital signal processor 52 may recover data by performing a digital processing on an output signal of the TIA circuit 30 (i.e., an electric field information signal of a received optical signal). The recovered data is sent to, for example, a designated information processing device.

As described above, a data signal generated by the digital signal processor 52 is supplied to the driver circuit 20, and an output signal of the TIA circuit 30 is supplied to the digital signal processor 52. Thus, the digital signal processor 52 and the optical transceiver device 1 are electrically connected to each other. For example, the connection may be provided by a metal wire or may be provide by another configuration.

As described above, the width W3 of the optical transceiver device 1 is narrower than the width W2 of the optical transceiver device 100 depicted in FIG. 1B. Hence, the size of the optical module 50 can be reduced by implementing the optical transceiver device 1 in the optical module 50. In particular, the optical module 50 can have a reduced width W4.

Implementation in Package

The optical transceiver device 1 is implemented in a package. An optical module is mounted with a package in which the optical transceiver device 1 is implemented. In the example depicted in FIG. 6, the optical transceiver device 1 implemented in a package is mounted in the optical module 50. A module configured by implementing the optical transceiver device 1 in a package may be referred to as an "optical transceiver module 2".

Figures 7A, 7B:
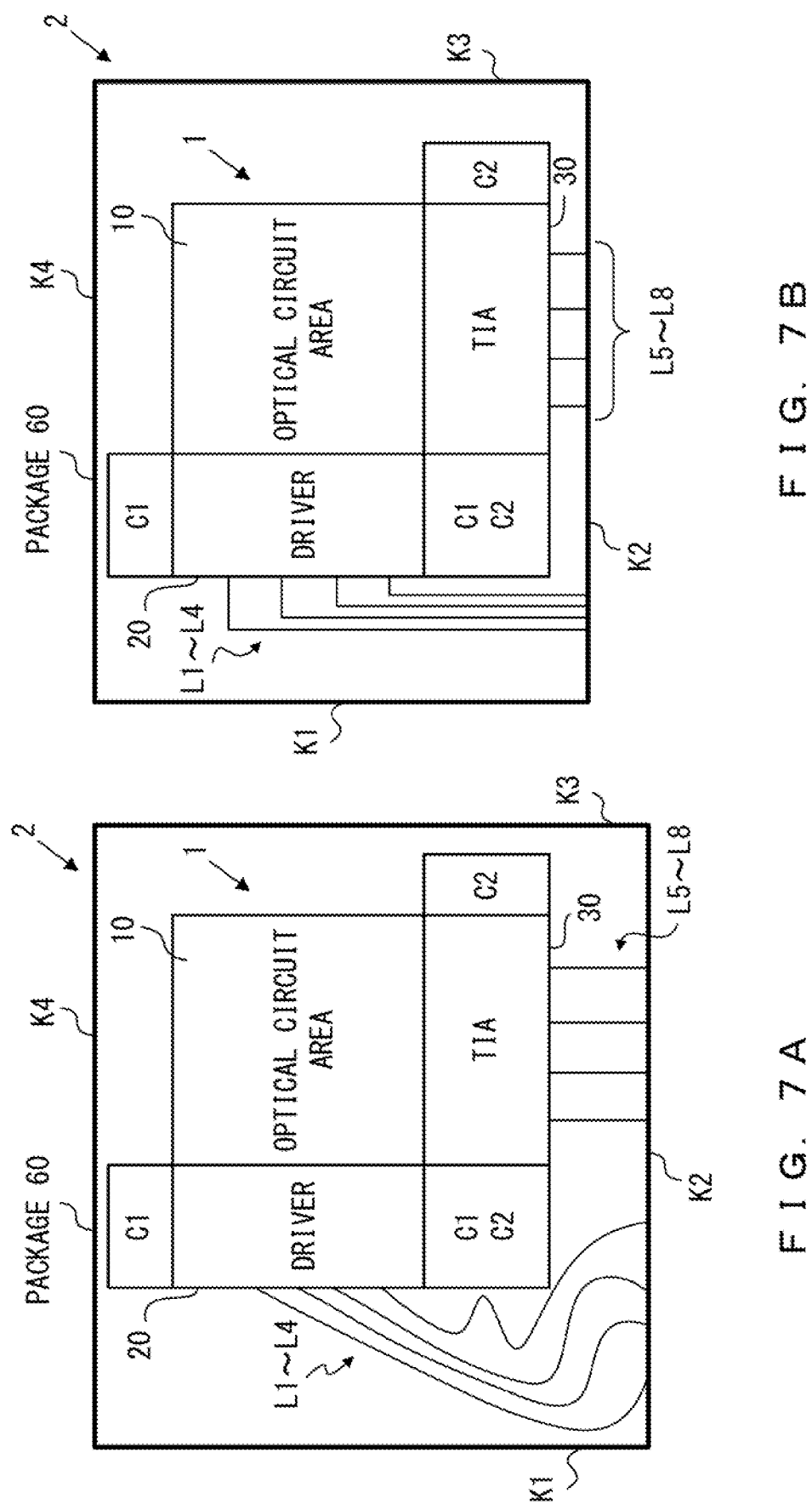
FIGS. 7A and 7B illustrate examples of implantations of an optical transceiver device in a package.

FIGS. 7A and 7B illustrate examples of implantations of the optical transceiver device 1 in a package. In these examples, a package 60 has a rectangular shape. In particular, the package 60 has four outer walls K1-K4. As depicted in FIG. 6, the package 60 in which the optical transceiver device 1 is implemented is located adjacent to the digital signal processor 52. Here, it is assumed that the package 60 (i.e., optical transceiver module 2) is disposed in a manner such that an outer wall K2 of the four outer walls of the package 60 faces the digital signal processor 52. In this case, electrical wirings electrically coupled to the optical transceiver device 1 are formed to reach the outer wall K2 in the package 60.

Electrical wirings L1-L4 are formed to electrically couple the driver circuit 20 to the digital signal processor 52. Electrical wirings L5-L8 are formed to electrically couple the TIA circuit 30 to the digital signal processor 52. To make skews between signals small, it is preferable that electrical wirings L1-L4 be equal in length and that electrical wirings L5-L8 be equal in length.

However, the driver circuit 20 is disposed to extend in a direction orthogonal to outer wall K2. Hence, for electrical wirings L1-L4, distances are different between outer wall K2 and positions at which edges of the electrical wirings are coupled to the driver circuit 20. Accordingly, a wiring pattern is determined for electrical wirings L1-L4 such that electrical wirings L1-L4 are equal in length as depicted in FIG. 7A. Since the TIA circuit 30 is parallel to outer wall K2, electrical wirings L5-L8 are respectively formed in straight.

The digital signal processor 52 can adjust skews between signals. For example, the digital signal processor 52 may adjust transmission timings for signals to be transmitted via electrical wirings L1-L4 in a manner such that these signals concurrently arrive at the driver circuit 20. The digital signal processor 52 may compensate for skews of signals received via electrical wirings L5-L8.

When the digital signal processor 52 adjusts skews, electrical wirings L1-L4 do not need to be equal in length. In this case, accordingly, electrical wirings L1-L4 are formed as shortest paths coupling the driver circuit 20 and outer wall K2, as depicted in FIG. 7B. As a result, in comparison with the configuration depicted in FIG. 7A, the size of the package 60 can be reduced, and the degradation of electric signals is mitigated.

Figure 8A:
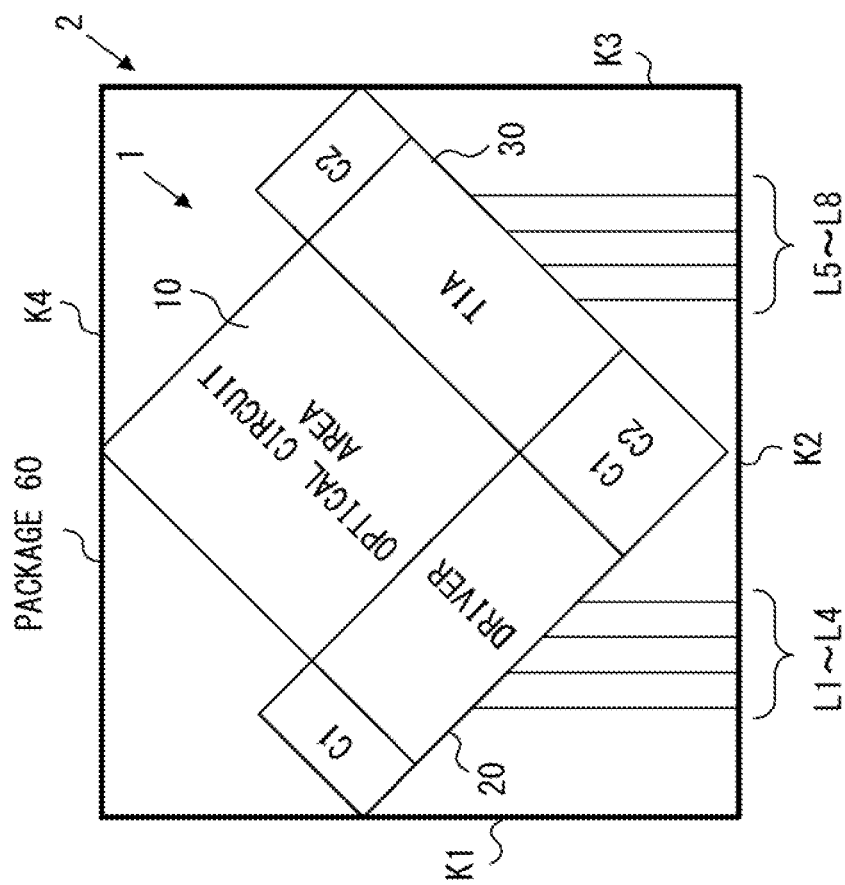
FIGS. 8A and 8B illustrate other examples of implantations of an optical transceiver device in a package.
Figure 8B:
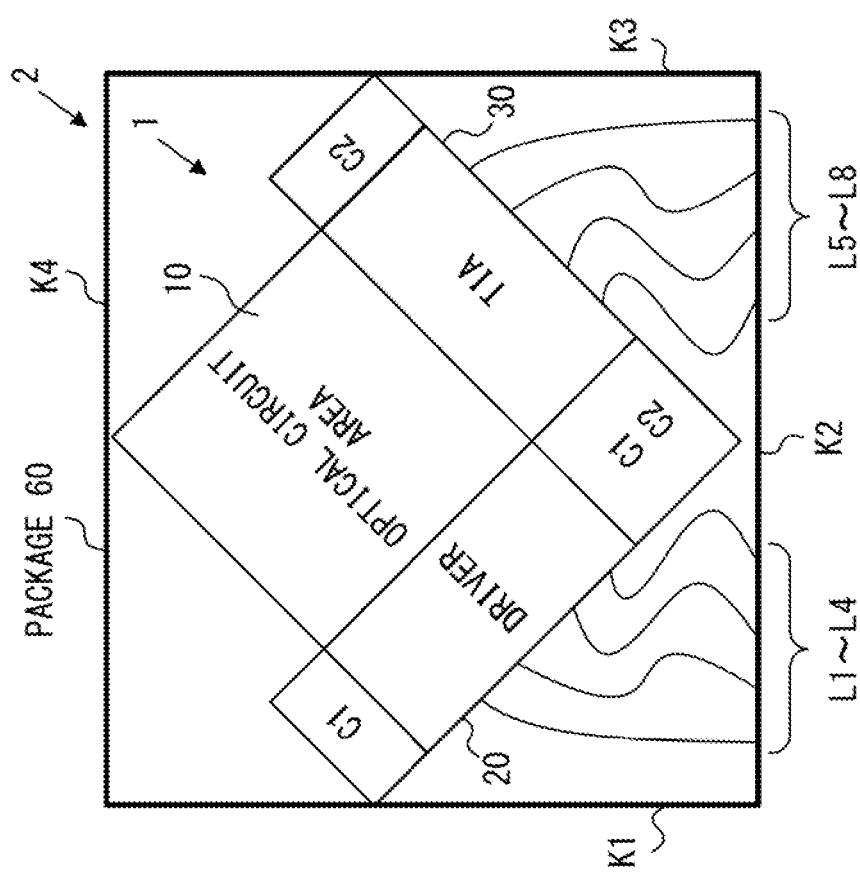

FIGS. 8A and 8B illustrate other examples of implantations of the optical transceiver device 1 in a package. In the examples depicted in FIGS. 7A and 7B, the optical transceiver device 1 is implemented in the package 60 in a manner such that each side of the optical circuit area 10 of the optical transceiver device 1 is parallel to a corresponding outer wall of the package 60. In the examples depicted in FIGS. 8A and 8B, by contrast, the optical transceiver device 1 is implemented in the package 60 in a manner such that each side of the optical circuit area 10 of the optical transceiver device 1 forms an angle of substantially 45 degrees with respect to a corresponding outer wall of the package 60. Note that "substantially 45 degrees" includes "about 45 degrees".

In the example depicted in FIG. 8A, electrical wirings L1-L4 are equal in length. Electrical wirings L5-L8 are also equal in length.

In a case where the digital signal processor 52 adjusts skews, as depicted in FIG. 8B, electrical wirings L1-L4 do not need to be equal in length, and electrical wirings L5-L8 also do not need to be equal in length. Accordingly, electrical wirings L1-L4 are formed as shortest paths coupling the driver circuit 20 and outer wall K2, as depicted in FIG. 8B. Similarly, electrical wirings L5-L8 are formed as shortest paths coupling the TIA circuit 30 and outer wall K2.

FIGS. 9A-9E illustrate examples of variations of arrangements in an optical transceiver device. For simplicity, only the optical circuit area 10, the driver circuit (DR) 20, the TIA circuit 30, and the optical interface (IF) 41 are indicated in FIGS. 9A-9E. That is to say, the peripheral circuits C1 and C2, the electrical interfaces 42 and 43, the termination circuit 44, electrical wirings L1-L8 and so on are omitted in these figures.

In FIGS. 9A-9E, broken-line frames indicate outer walls of the package 60. The optical module 50 is mounted with the package 60 (i.e., optical transceiver device 1 or optical transceiver module 2) in a manner such that outer wall K2 faces the digital signal processor 52.

Figure 9A:
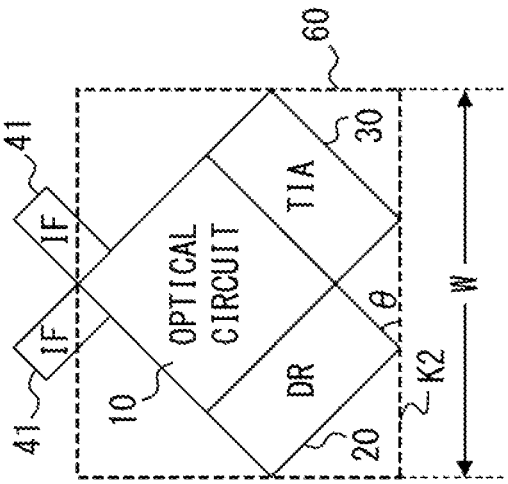
FIGS. 9A-9E illustrate examples of variations of arrangements in an optical transceiver device.

In the configuration depicted in FIG. 9A, the optical transceiver device 1 is implemented in the package 60 in a manner such that each side of the optical circuit area 10 is parallel to a corresponding outer wall of the package 60. The driver circuit 20 is located between the optical circuit area 10 and outer wall K1, and the TIA circuit 30 is located between the optical circuit area 10 and outer wall K2. In addition, the optical interface 41 projects from outer wall K4.

Figure 9B:
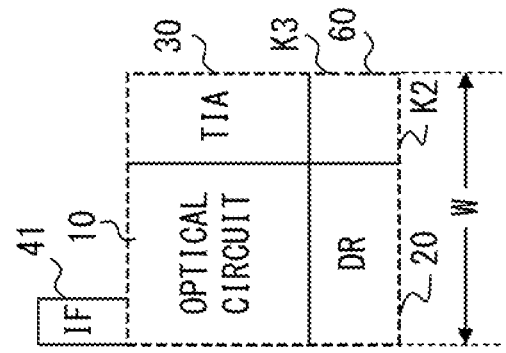

In the configuration depicted in FIG. 9B, the optical transceiver device 1 is also implemented in the package 60 in a manner such that each side of the optical circuit area 10 is parallel to a corresponding outer wall of the package 60. In the configuration depicted in FIG. 9B, however, the driver circuit 20 is located between the optical circuit area 10 and outer wall K2, and the TIA circuit 30 is located between the optical circuit area 10 and outer wall K3.

Figure 9C:
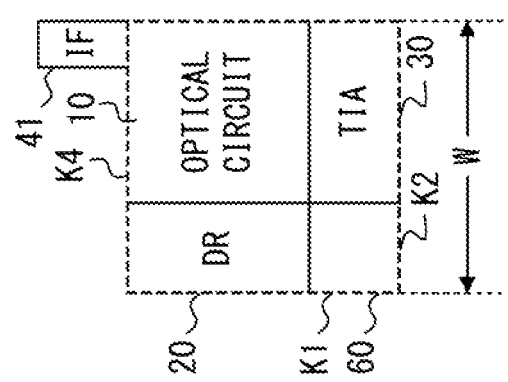

In the configuration depicted in FIG. 9C, the optical transceiver device 1 is implemented in the package 60 in a manner such that each side of the optical circuit area 10 of the optical transceiver device 1 forms an angle of substantially 45 degrees with respect to a corresponding outer wall of the package 60. Thus, in FIG. 9C, angle θ is substantially 45 degrees. Although FIG. 9C depicts two optical interfaces 41, only one of these interfaces may be implemented.

Figure 9D:
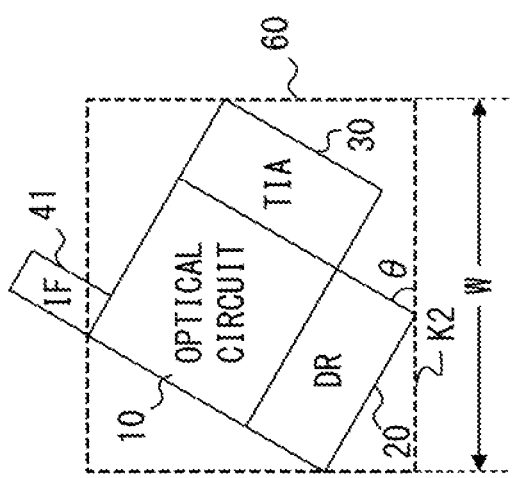

In the configuration depicted in FIG. 9D, the optical transceiver device 1 is implemented in the package 60 in a manner such that each side of the optical circuit area 10 of the optical transceiver device 1 forms an angle smaller than 45 degrees with respect to a corresponding outer wall of the package 60. Thus, in FIG. 9D, angle θ is smaller than 45 degrees.

Figure 9E:
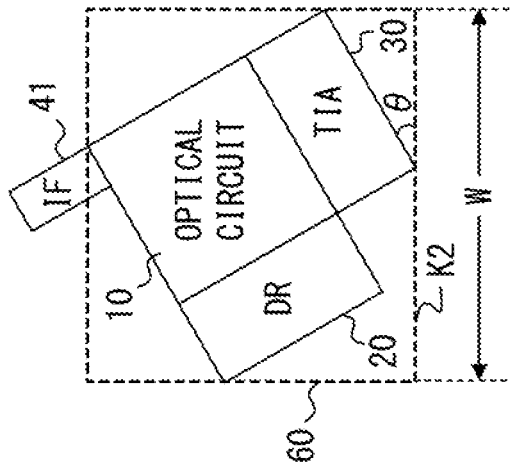

In the configuration depicted in FIG. 9E, the optical transceiver device 1 is implemented in the package 60 in a manner such that each side of the optical circuit area 10 of the optical transceiver device 1 forms an angle larger than 45 degrees with respect to a corresponding outer wall of the package 60. Thus, in FIG. 9E, angle θ is larger than 45 degrees.

The configurations depicted in FIGS. 9A-9B (hereinafter referred to as an L-shaped configuration) have the following characteristics in comparison with the other configurations:
(1) The lengths of the electrical wirings L1-L4 coupled to the driver circuit 20 are greatly different from the lengths of the electrical wirings L5-L8 coupled to the TIA circuit 30. In the configuration depicted in FIG. 9A, the electrical wirings L1-L4 coupled to the driver circuit 20 are longer, and in the configuration depicted in FIG. 9B, the electrical wirings L5-L8 coupled to the TIA circuit 30 are longer.
(2) The degree of flexibility in the positioning of the optical interface 41 is low.
(3) The width W is small.

The configuration depicted in FIG. 9C (hereinafter referred to as a V-shaped configuration) has the following characteristics in comparison with the other configurations:
(1) The lengths of the electrical wirings L1-L4 coupled to the driver circuit 20 and the lengths of the electrical wirings L5-L8 coupled to the TIA circuit 30 have a small difference therebetween.
(2) The degree of flexibility in the positioning of the optical interface 41 is high.
(3) The width W is large.

The configurations depicted in FIGS. 9D-9E (hereinafter referred to as an intermediate configuration) have characteristics intermediate between those of the L-shaped configuration depicted in FIGS. 9A-9B and the V-shaped configuration depicted in FIG. 9C. In particular, the intermediate configuration has characteristics close to those of the L-shaped configuration when angle θ is close to zero. Meanwhile, the intermediate configuration has characteristics close to those of the V-shaped configuration when angle θ is close to 45 degrees.

Accordingly, the arrangement in the optical transceiver device 1 is desirably determined in accordance with needs in the design of the optical module 50. In, for example, a case where a narrow width W is needed, the L-shaped configuration depicted in FIG. 9A or 9B is preferable.

However, as described above with reference to FIG. 5, the optical transceiver device 1 includes a termination circuit 44 that terminates a driving signal supplied from the driver circuit 20 to the optical modulator 11. The termination circuit 44 is disposed in an area opposite from an area in which the driver circuit 20 is disposed with respect to the optical circuit area 10. Thus, in the configuration depicted in FIG. 9B, the termination circuit 44 is disposed in the vicinity of the optical interface 41. Hence, it may be difficult to lay out the optical interface 41 and the termination circuit 44 in the configuration depicted in FIG. 9B.

In the configuration depicted in FIG. 9A, as described above, the electrical wirings L5-L8 coupled to the TIA circuit 30 are shorter than the electrical wirings L1-L4 coupled to the driver circuit 20. In this case, the degradation of an output signal of the TIA circuit 30 (i.e., an electric signal indicating electric field information of a received optical signal) is mitigated. Accordingly, when, for example, the quality of a signal that is requested in the communication system and the quality of an optical signal received by the optical transceiver device 1 have a small margin therebetween, it will be more preferable to use the configuration depicted in FIG. 9A than the configuration depicted in FIG. 9B.

In the configuration depicted in FIG. 9B, the electrical wirings L1-L4 coupled to the driver circuit 20 are shorter than the electrical wirings L5-L8 coupled to the TIA circuit 30. In this case, the degradation of an output signal of the driver circuit 20 (i.e., a driving signal for generating a modulated optical signal) is mitigated. Accordingly, when, for example, the quality of a signal that is requested in the communication system and the quality of an optical signal transmitted by the optical transceiver device 1 have a small margin therebetween, it will be more preferable to use the configuration depicted in FIG. 9B than the configuration depicted in FIG. 9A.

Variations of Arrangements in Optical Transceiver Device

FIGS. 10A, 10B, 11A, 11B, 12A, and 12B illustrate variations of arrangements in an optical transceiver device. The elements other than the optical circuit area 10, the driver circuit (DR) 20, the TIA circuit 30, the optical interface (O_IF) 41, the electrical interfaces (E_IFs) 42 and 43, and peripheral circuits C1 and C2 are omitted in FIGS. 10A, 10B, 11A, 11B, 12A, and 12B. Peripheral circuit C1 is, for example, a capacitor electrically coupled to an amplifier included in the driver circuit 20. Peripheral circuit C2 is, for example, a capacitor electrically coupled to an amplifier included in the TIA circuit 30.

Figure 10A:
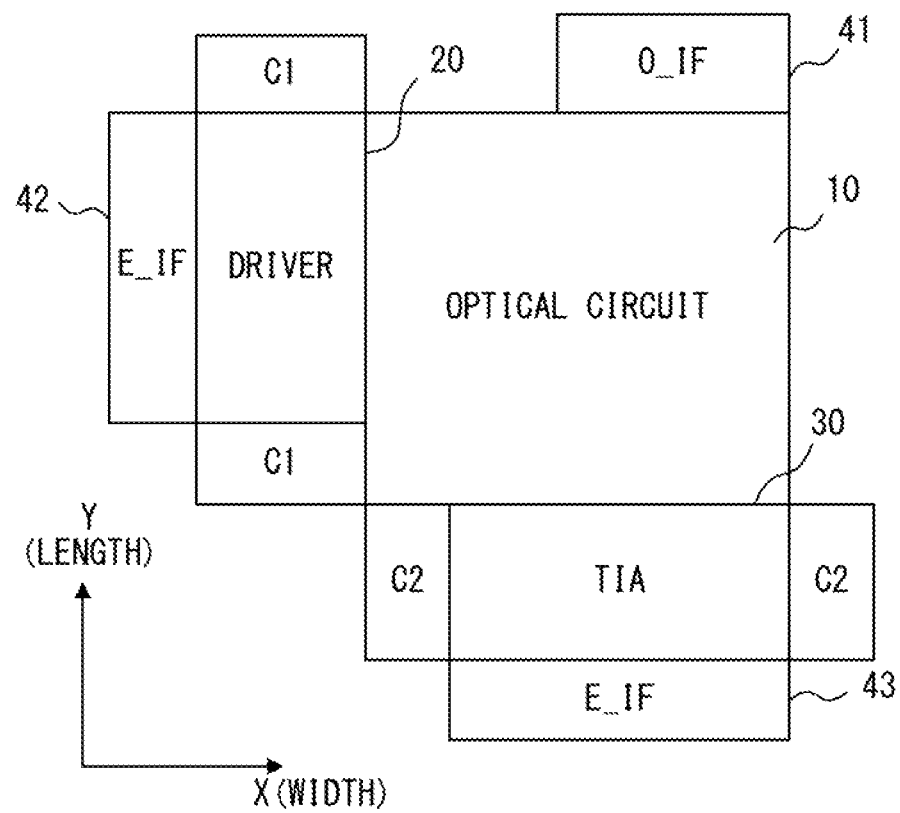

The following describes the configurations depicted in FIGS. 10B, 11A, 11B, 12A, and 12B with reference to the configuration depicted in FIG. 10A. The optical transceiver device depicted in FIG. 10A corresponds to the configuration depicted in FIG. 2. In descriptions related to FIGS. 10A, 10B, 11A, 11B, 12A, and 12B, X direction and Y direction may be referred to as a "width" and "a "length (or height)", respectively. The following descriptions are based on the premise that the size of the driver circuit 20 is equal in FIGS. 10A, 10B, 11A, 11B, 12A, and 12B and that the size of the TIA circuit 30 is also equal in these figures, but the present invention is not particularly limited to this.

Figure 10B:
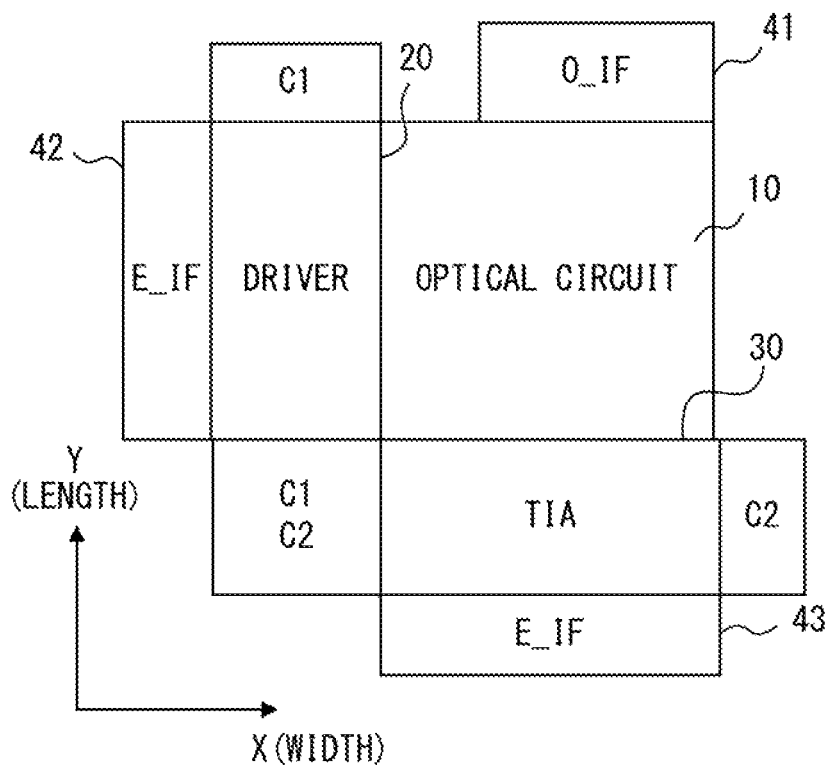

In the example depicted in FIG. 10B, the optical circuit area 10 has a length (or height) that is almost the same as that of the driver circuit 20, and the optical circuit area 10 has a width that is almost the same as that of the TIA circuit 30. Thus, when the size of the optical circuit area 10 can be made smaller than that in the configuration depicted in FIG. 10A, the configuration depicted in FIG. 10B may be used. In this configuration, the peripheral circuit C1 of the driver circuit 20 and the peripheral circuit C2 of the TIA circuit 30 may be disposed in a shared area located under and to the left of the optical circuit area 10.

In the example depicted in FIG. 11A, the optical circuit area 10 has a length that is greater than that of the driver circuit 20, and the optical circuit area 10 has a width that is almost the same as that of the TIA circuit 30. Thus, when the width of the optical circuit area 10 can be made narrower than that in the configuration depicted in FIG. 10A, the configuration depicted in FIG. 11A may be used.

In the example depicted in FIG. 11B, the optical circuit area 10 has a length that is almost the same as that of the driver circuit 20, and the optical circuit area 10 has a width that is wider than that of the TIA circuit 30. Thus, when the length of the optical circuit area 10 can be made less than that in the configuration depicted in FIG. 10A, the configuration depicted in FIG. 11B may be used.

In the example depicted in FIG. 12A, the width of the optical circuit area 10 is narrower than that of the TIA circuit 30. In this case, the driver circuit 20 may be located at a position shifted in Y direction with respect to the configuration depicted in FIG. 10A.

In the example depicted in FIG. 12B, the length of the optical circuit area 10 is less than that of the driver circuit 20. In this case, the TIA circuit 30 may be located at a position shifted in X direction with respect to the configuration depicted in FIG. 10A.

As described above, various arrangements are possible in the optical transceiver device 1 in accordance with the size of the optical circuit area 10, the driver circuit 20, or the TIA circuit 30. In each of the cases depicted in FIGS. 10A, 10B, 11A, 11B, 12A, and 12B, however, at least a portion of peripheral circuits C1 and C2 is implemented in an area that is located outside the optical circuit area 10 and sandwiched by the driver circuit 20 and the TIA circuit 30 (an area located under and to the left of the optical circuit area 10).

Figure 13:
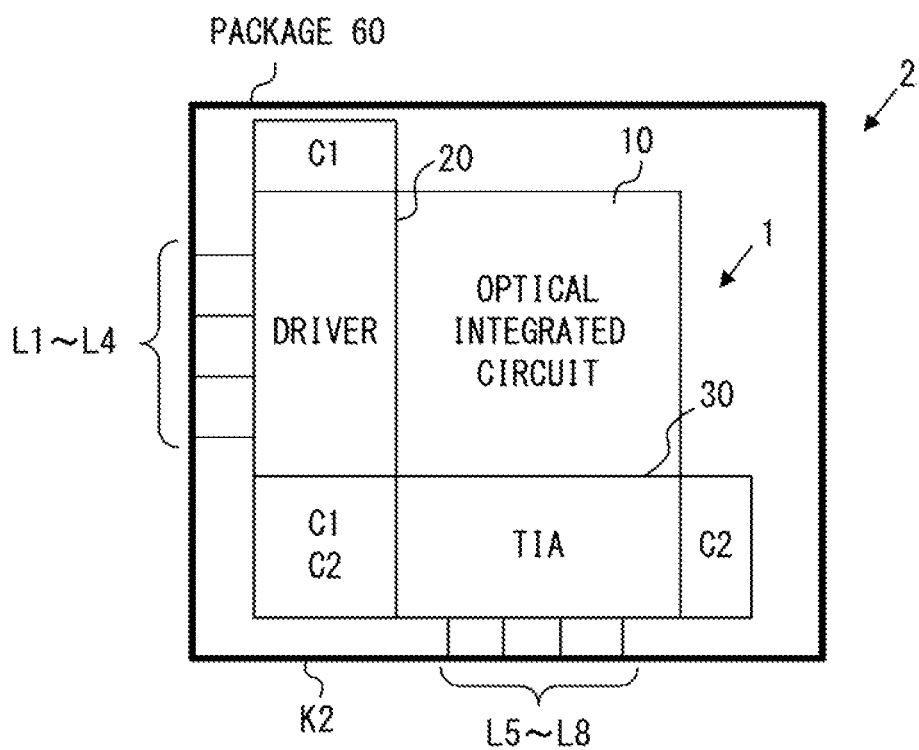
FIG. 13 illustrates an example of another variation of an arrangement in an optical transceiver device.

FIG. 13 illustrates an example of another variation of an arrangement in an optical transceiver device. In the examples depicted in FIGS. 7A-8B, the electrical wirings L1-L4 electrically coupled to the driver circuit 20 and the electrical wirings L5-L8 electrically coupled to the TIA circuit 30 are all formed to reach the outer wall K2 of the package 60. In the example depicted in FIG. 13, by contrast, electrical wirings L1-L4 do not extend to outer wall K2.

Assume that the digital signal processor 52 in the optical module 50 is located in the vicinity of the outer wall K2 of the package 60. In this case, for example, electrical wirings L1-L4 may be electrically coupled, at an underside of the package 60, to a conductive pattern formed on a substrate of the optical module 50. This configuration allows the size of the package 60 to be made smaller and thus contributes to reduction in size of the optical module 50.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An optical transceiver device comprising:
    an optical circuit implemental in a rectangular optical circuit area, the optical circuit including an optical modulator that includes a Mach-Zehnder modulator, having an optical waveguide, to generate a modulated optical signal and an optical reception circuit that includes a plurality of photodetectors to convert a received optical signal into electric signals;
    a driver circuit that drives the optical modulator, and that is arranged outside the rectangular optical circuit area and along a first side among four sides of the rectangular optical circuit area;
    an amplifier circuit that converts an output signal of the optical reception circuit into a voltage signal, and that is arranged outside the rectangular optical circuit area and along a second side among the four sides of the rectangular optical circuit area, the second side being orthogonal to the first side, the plurality of photodetectors being arranged in the rectangular optical circuit area along the second side of the rectangular optical circuit area;
    a signal electrode electrically coupled to the driver circuit and formed in the rectangular optical circuit area extending straight from the first side to a third side facing the first side, the optical waveguide that is a component of the Mach-Zehnder modulator being formed along the signal electrode;
    a first electrical component that is electrically coupled to the driver circuit, and that is arranged in an area adjacent to the driver circuit; and
    a second electrical component that is electrically coupled to the amplifier circuit, and that is arranged in an area adjacent to the amplifier circuit.

2. The optical transceiver device according to claim 1, wherein at least one of the first electrical component and the second electrical component is disposed in an area located outside the optical circuit area and sandwiched by the driver circuit and the amplifier circuit.

3. The optical transceiver device according to claim 1, wherein
    the first electrical component is implemented in an area located outside the optical circuit area, adjacent to the driver circuit, and positioned on a side on which the amplifier circuit is provided with respect to the driver circuit, and
    the second electrical component is implemented in an area located outside the optical circuit area, adjacent to the amplifier circuit, and positioned on a side on which the driver circuit is provided with respect to the amplifier circuit.

4. The optical transceiver device according to claim 1, wherein
the first electrical component is a capacitor electrically coupled to a power line for supplying a power supply voltage to the driver circuit, and
the second electrical component is a capacitor electrically coupled to a power line for supplying a power supply voltage to the amplifier circuit.

5. An optical transceiver device, comprising:
a driver circuit arranged along a first side among four sides of a rectangular optical circuit area;
an optical circuit implemented in the rectangular optical circuit area, including
an optical modulator that includes a Mach-Zehnder modulator, driven by the driver circuit to generate a modulated optical signal, and
an optical reception circuit that includes a plurality of photodetectors to convert a received optical signal into electric signals, the plurality of photodetectors being arranged in the rectangular optical circuit area along a second side among the four sides of the rectangular optical circuit area, the second side being orthogonal to the first side;
an amplifier circuit, arranged along the second side, that converts an output signal of the optical reception circuit into a voltage signal;
a first electrical component electrically coupled to the driver circuit and arranged in an area adjacent to the driver circuit; and
a second electrical component electrically coupled to the amplifier circuit and arranged in an area adjacent to the amplifier circuit,
a signal electrode electrically coupled to the driver circuit and formed in the rectangular optical circuit area extending straight from the first side to a third side facing the first side;
a first optical port and a second optical port provided at a fourth side facing the second side;
an optical waveguide that is a component of the Mach-Zehnder modulator, formed along the signal electrode;
a first optical wiring optically coupled to the first optical port and optically coupled, in the rectangular optical circuit area, to an output terminal of the optical modulator; and
a second optical wiring optically coupled to the second optical port and optically coupled, in the rectangular optical circuit area, to the optical reception circuit.

6. An optical transceiver module, comprising:
an optical transceiver device; and
a package in which the optical transceiver device is implemented,
wherein the optical transceiver device includes:
an optical circuit implemented in a rectangular optical circuit area, the optical circuit including an optical modulator that includes a Mach-Zehnder modulator, having an optical waveguide, to generate a modulated optical signal and an optical reception circuit that includes a plurality of photodetectors to convert a received optical signal into electric signals,
a driver circuit that drives the optical modulator, and that is arranged outside the rectangular optical circuit area and along a first side among four sides of the rectangular optical circuit area,
an amplifier circuit that converts an output signal of the optical reception circuit into a voltage signal, and that is arranged outside the rectangular optical circuit area and along a second side among the four sides of the rectangular optical circuit area, the second side being orthogonal to the first side, the plurality of photodetectors being arranged in the rectangular optical circuit area along the second side of the rectangular optical circuit area;
a signal electrode electrically coupled to the driver circuit and formed in the rectangular optical circuit area extending straight from the first side to a third side facing the first side, the optical waveguide that is a component of the Mach-Zehnder modulator being formed along the signal electrode;
a first electrical component that is electrically coupled to the driver circuit, and that is arranged in an area adjacent to the driver circuit, and
a second electrical component that is electrically coupled to the amplifier circuit, and that is arranged in an area adjacent to the amplifier circuit.

7. The optical transceiver module according to claim 6, wherein
the package has a rectangular shape, and
the optical transceiver device is implemented in the package in a manner such that each of the sides of the optical circuit area forms a designated angle with respect to a corresponding outer wall of the package.

8. The optical transceiver module according to claim 6, wherein
the package has a rectangular shape, and
the optical transceiver device is implemented in the package in a manner such that each of the sides of the optical circuit area forms an angle of substantially 45 degrees with respect to a corresponding outer wall of the package.

* * * * *